United States Patent
Belousov et al.

(10) Patent No.: US 7,329,436 B2
(45) Date of Patent: Feb. 12, 2008

(54) VAPOR DEPOSITION OF DISSIMILAR MATERIALS

(75) Inventors: Igor V. Belousov, Kiev (UA); Igor S. Malashenko, Kiev (UA); Gregory A. Serhiyenko, Kiev (UA); Anatoli N. Shelkovoi, deceased, late of Kiev (UA); by Evgeniy A. Shelkovoy, legal representative, Kiev (UA); Robert L. Memmen, Cheshire, CT (US); David A. Rutz, Glastonbury, CT (US); Monika D. Kinstler, Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 358 days.

(21) Appl. No.: 10/991,605

(22) Filed: Nov. 17, 2004

(65) Prior Publication Data

US 2006/0105195 A1    May 18, 2006

(51) Int. Cl.
   *C23C 16/00*    (2006.01)
(52) U.S. Cl. .................................. 427/250
(58) Field of Classification Search .............. 427/250
   See application file for complete search history.

(56) References Cited

U.S. PATENT DOCUMENTS 3,356,487 A    12/1967    Hunt et al.
5,474,809 A  * 12/1995    Skelly et al. ............... 427/250
6,145,470 A    11/2000    Bruce et al.
6,190,473 B1    2/2001    Martin
6,689,199 B2    2/2004    Corderman et al.
2003/0047139 A1 *  3/2003   Corderman et al. .. 118/723 EB
2005/0205415 A1 *  9/2005   Belousov et al. ...... 204/192.16

FOREIGN PATENT DOCUMENTS

GB    1344972    1/1974

OTHER PUBLICATIONS

Smith et al, Metallurgical Characteristics of Titanium-Alloy Foil Prepared by Electron-Beam Evaporation, 1970, The Journal of Vacuum Science and Technology, vol. 7, No. 6, S48-S50.*
H.R. Smith, Jr. et al., Metallurgical Characteristics of Titanium-Alloy Foil Prepared by Electron-Beam Evaporation, The Journal of Vacuum Science and Technology, Nov. 1970, pp. 48-51, vol. 7, No. 6, Berkely, California.
Patent Abstracts of Japan, JP Publication No. 2001123255, published May 8, 2001.

(Continued)

*Primary Examiner*—Timothy Meeks
*Assistant Examiner*—Elizabeth Burkhart
(74) *Attorney, Agent, or Firm*—Bachman & LaPointe, P.C.

(57) ABSTRACT

A method for depositing a first material on a substrate includes providing the substrate in a deposition chamber. A molten body is formed between the substrate and a source of the first material by melting one or more second materials. A flow of the first material is passed through the molten body and from the molten body to the substrate as a vapor flow. An essentially non-expending portion of the molten body comprises an alloy having a melting temperature below a melting temperature of the first material.

20 Claims, 6 Drawing Sheets

OTHER PUBLICATIONS

European Search Report for EP Patent Application No. 05256894.6.

O.M. Ivasishin et al., Laser Surface Treatment of VT6 and VT23 Titanium Alloys, Int. J. of Materials & Products Technology, Special Issue, 1991, V. 1, pp. 204-212.

O.M. Ivasishin et al., Enhancing the Mechanical Properties of Titanium Alloys with Rapid Heat Treatment (Overview), JOM, 1996, #7, pp. 48-52.

O.M. Ivasishin et al., Rapid Heat Treatment of TIMETAL® LCB Alloy, In: TITANIUM '99: Science and Technology, Proceedings of the 9th World conference, St. Petersburg, Russia, CRISM "Prometey", 2000, v. 1, pp. 505-512.

O.M. Ivasishin et al., Grain Growth and Texture Evolution in Ti-6Al-4V During Beta Annealing under Continuous Heating Conditions, Materials Sci. & Eng. A, 337/1-2 (2002), pp. 88-96.

O.M. Ivasishin et al., Precipitation and Recrystallization Behavior of Beta Titanium Alloys During Continuous Heat Treatment, Metall. Materials Transactions A, 2003, vol. 34A, pp. 147-158.

O.M. Ivasishin et al., Rapid Heat Treatment of High-Strength Titanium Alloys, In: Metallurgy and Technology of Practical Titanium Alloys, Ed. By S. Fujishiro, D. Eylon and T. Kishi, TMS publication, 1994, pp. 283-292.

O.M. Ivasishin et al., The Effect of Rapid Heating on $\beta$-Grain Size and Fatigue Properties of ($\alpha+\beta$) Titanium Alloys, In: Titanium '88: Science and Technology, Proceedings of the 6th World conference, Ed. P. Lacombe et al., Les Ed. de Phys., V. 1 (1988) pp. 99-110.

P.E. Markovsky, Improvement of Structure and Mechanical Properties of Cast Titanium Alloys Using Rapid Heat Treatment, Materials Science and Engineering, A190 (1995), pp. L9-L12.

* cited by examiner

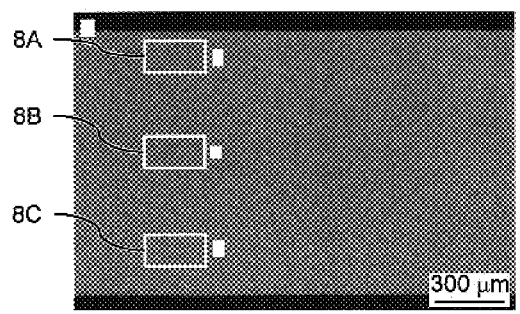
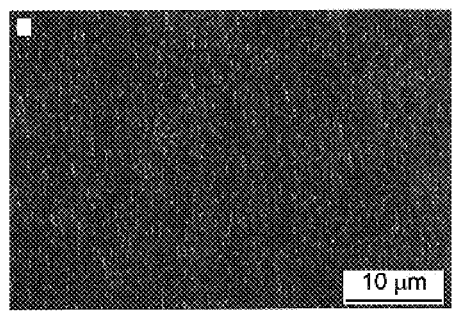
FIG.8
FIG.8B
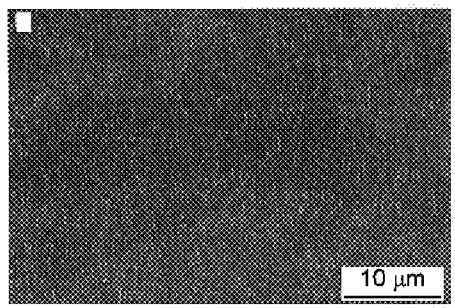
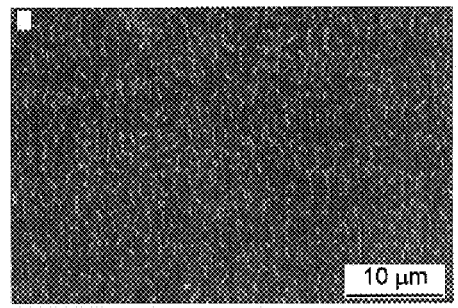
FIG.8A
FIG.8C

VAPOR DEPOSITION OF DISSIMILAR MATERIALS

BACKGROUND OF THE INVENTION

The invention relates to an vapor deposition of metallic materials. More particularly, the invention relates to the evaporation of materials which include elements with significantly different vapor pressures.

It is desirable to use vapor deposition to deposit materials whose components are of different vapor pressures. These include many Ti-, Co-, and Ni-based alloys.

There are a various thermal methods for evaporating solid materials in physical vapor deposition (PVD), including: resistance or induction heating; electron beam physical vapor deposition (EBPVD); laser deposition; and variations thereon. These methods may be used to evaporate and deposit metal alloys with components to have different vapor pressures. Nevertheless, such deposition can involve a variety of homogeneity problems with the deposited material (condensate).

Methods have been developed to evaporate the components of such alloys through pools comprising refractory materials. Examples are found in: Shiller, Z., Gaizig, U., and Pantser, Z., Electron-beam Technology, M. Energy, 1980, p 528; Physical Vapor Deposition, Airco Temescal, 1976, p 190; and U.S. Pat. No. 5,474,809. The '809 patent teaches a pool having a refractory component with lower vapor pressure than the components of the deposition material. The deposition material components are transported through the pool, forming a vapor stream at the pool surface. The deposition material components are continuously replaced by new material melting from the ingot. The refractory component is essentially non-consumed or is consumed in small, controllable quantities.

SUMMARY OF THE INVENTION

One aspect of the invention involves a method for depositing a first material on a substrate. The substrate is placed in a deposition chamber. A molten body is formed between the substrate and a source of the first material by melting one or more second materials. A flow of the first material is passed through the molten body and from the molten body to the substrate as a vapor flow. An essentially non-expending portion of the molten body comprises an alloy having a melting temperature below a melting temperature of the first material.

In various implementations, the first material may be Ti-based. The second material may comprise Zr and Mo. The first material may comprise or may consist essentially of Ti, Al, and V. The Al and V may be deposited with specific standard deviations no greater than 10%. The deposited first material may have a thickness of at least 2 mm. The first material may be codeposited with a third material to form a condensate. The third material may not pass through the molten body. The condensate may comprise at least one weight percent of one or each of Zr and Mo from said third material. The condensate may consist essentially of one of Ti-6Al-2Sn-4Zr-2Mo and Ti-8Al-1Mo-1V. The nonexpending portion may comprise, by weight, at least 50% Zr and at least 20% Mo. The nonexpending portion may comprise, in major weight part, a near eutectic mixture of two elements. The substrate may be a Ti alloy turbomachine part. The deposited first material may be separated from the substrate. The separating may comprise releasing, destructive or non-destructive of the substrate. The substrate may be a damaged part and the first material may replace lost material.

Another aspect of the invention involves a method for depositing a Ti based first material on a substrate. The substrate is placed in a deposition chamber. A molten body is formed between the substrate and a source of one or more components of the first material by melting one or more second materials including Zr and Mo. The one or more components of the first material are melted from said source so that said one or more components are transported through the molten body to a top surface where they are preferentially evaporated with respect to the Zr and Mo thereby forming a vapor stream. A condensate having a thickness is collected from the vapor stream.

In various implementations, the first material may comprise or consist essentially of Ti, Al, and V. The second material may consist essentially of Zr and Mo and the first material may consist essentially of Ti, Al, and V.

Another aspect of the invention involves an apparatus for depositing a condensate on a substrate. The apparatus comprises a chamber containing a first surface of the substrate. A liquid body comprises essentially non expending quantities of one or more intermediate materials. A vapor flow of the condensate passes from the liquid body toward the substrate first surface At least one solid body is in contact with the liquid body and comprising of one or more components of the condensate. There is a flow from the solid body through the liquid body to form the vapor flow. The one or more intermediate materials are in a proportion having a melting point below a melting point of the condensate.

In various implementations, an electron beam source may direct an electron beam to the liquid body. The at least one solid body may be a single body of an alloy of at least Ti, Al, and V. The one or more intermediate materials may comprise an alloy of Zr and Mo. The condensate may consist essentially of Ti 6Al-4V. The chamber may have a pressure less than 0.01 Pa.

Another aspect of the invention involves an apparatus for depositing material on a substrate. There is a deposition chamber. There is a source of said deposition material having at least first and second elements. There is means for vaporizing said deposition material from said source. There is means for limiting laminar variations in concentration of the first and second elements in the deposition material as deposited on the substrate.

In various implementations, the means for limiting may comprise a pool containing third and fourth relatively non-expending elements in a proportion having a melting point at least 200° C. less than a lower of the melting points of the third and fourth elements.

Another aspect of the invention involves a metallic part comprising a substrate. A deposited material has a first interface with the substrate, the material comprising, in major part, a combination of Ti, Al, and V and lacking laminar variations in Al concentration of more than 10% specific standard deviation over at least one thickness span in excess of 50 μm.

In various implementations, the at least one thickness span may include a single span in excess of 500 μm. The material may consist essentially of Ti, Al, and V. The substrate and the material may each comprise Ti alloys of like nominal composition.

The details of one or more embodiments of the invention are set forth in the accompanying drawings and the descrip-

BRIEF DESCRIPTION OF THE DRAWINGS

FIG. 8 is a SEM cross-section image of nominal Ti-6Al-4V EBPVD condensate deposited through a Zr—Mo intermediate.

FIGS. 8A-8C are enlarged views of the image of FIG. 8.

Like reference numbers and designations in the various drawings indicate like elements.

DETAILED DESCRIPTION

Figure 1:
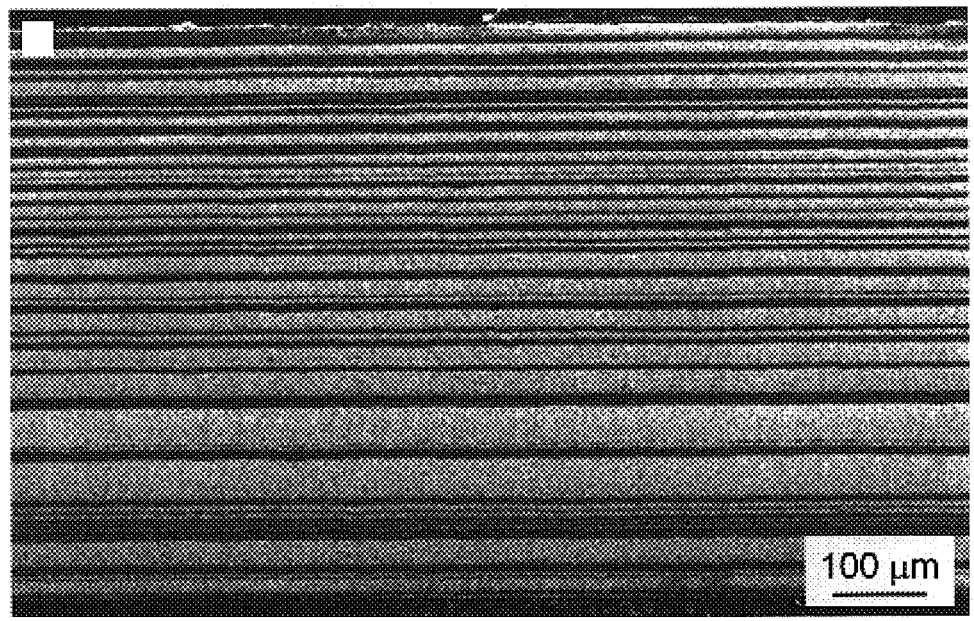
FIGS. 1 and 2 are SEM cross-section images of nominal Ti-6Al-4V EBPVD condensate deposited through a Ta intermediate.
Figure 2:
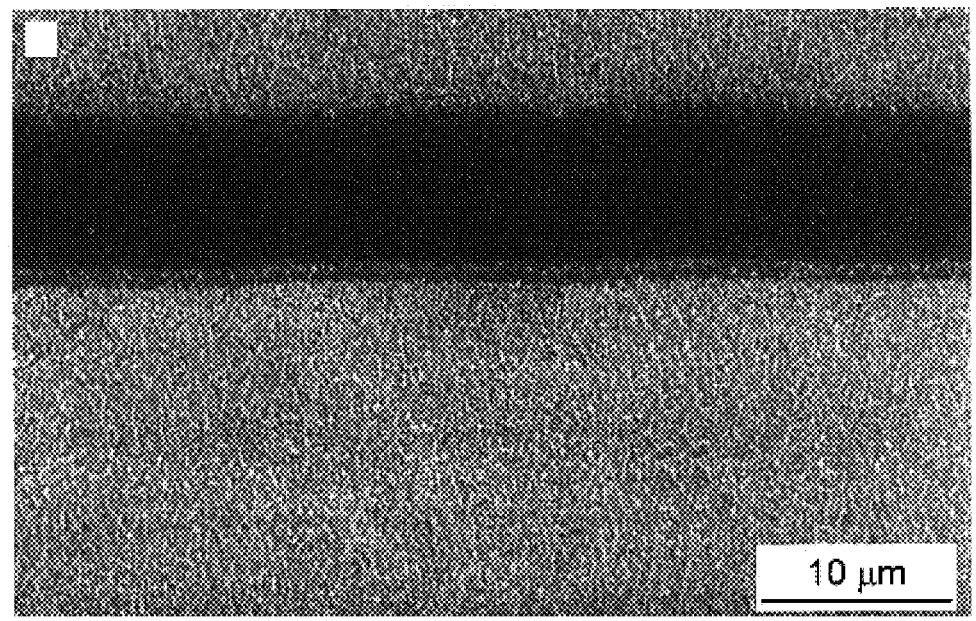

Despite improvements enabling deposition of multi-component materials, homogeneity and repeatability problems remain. One group of observed inhomogeneities involves laminar variation in the content of relatively high vapor pressure elements (HVPE) such as Al, Cr, and the like. For example, FIGS. 1 and 2 show nominal Ti-6Al-4V EBPVD condensate deposited through a pool comprising Ta into which a Ti-7Al-4V ingot is continuously fed. The extra aluminum compensates for depletion from the core of the vapor stream. The lower molecular weight of Al (relative to the immediately adjacent Ti and V weights) causes greater Al mobility and thus renders the vapor stream core Al-depleted and the periphery of the vapor stream Al-rich.

Figure 3:
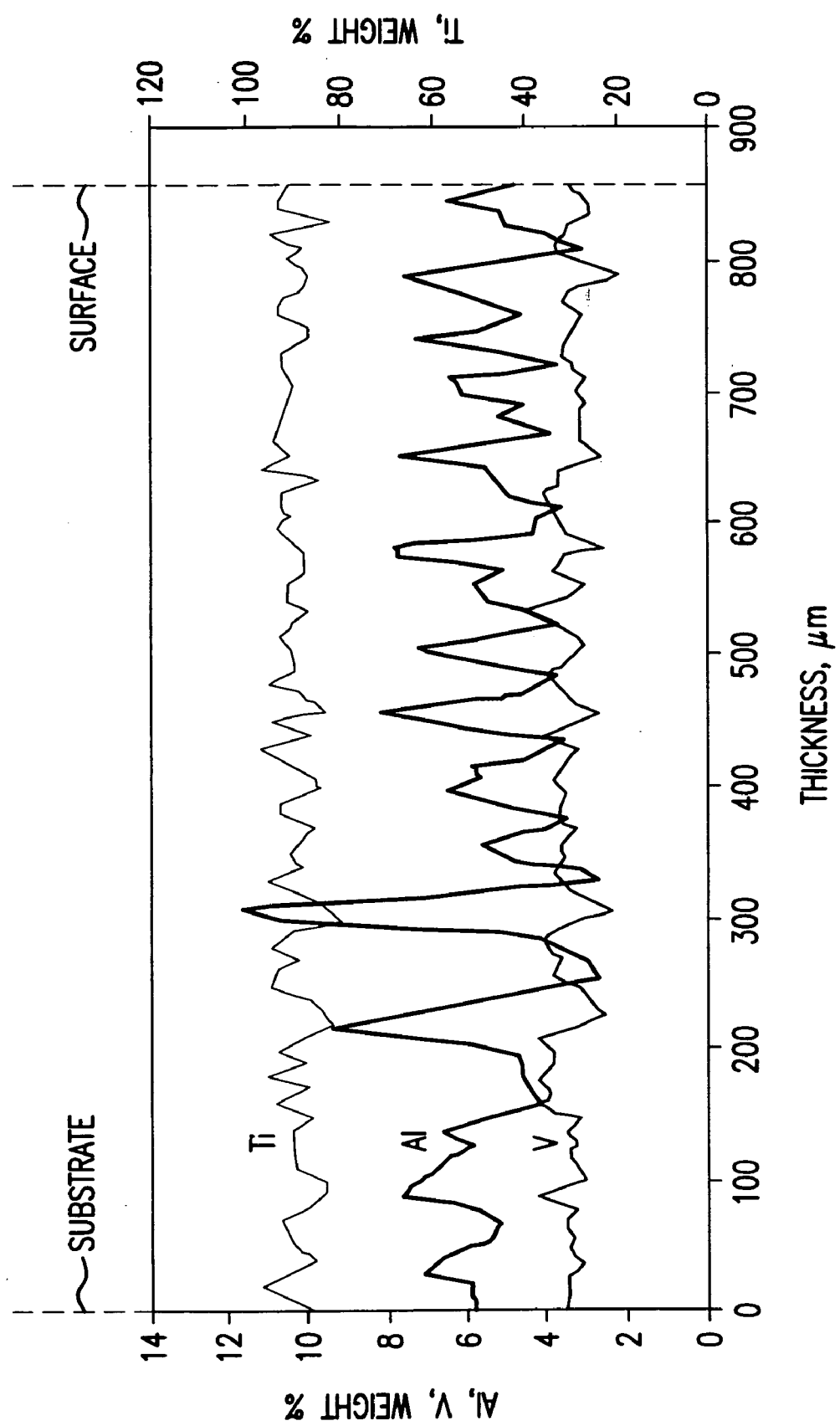
FIG. 3 is a graph of the concentration of the components of the condensate of FIGS. 1 and 2 across the condensate thickness.

Laminar inhomogeneity is readily visible. The dark zones in FIGS. 1 and 2 are layers rich in Al. FIG. 3. shows concentrations of Ti, Al, and V in the condensate of FIGS. 1 and 2. Substantial variations are seen. Noteworthy are the substantial Al and V concentration variations. These may be quantified. One exemplary quantification is specific standard deviation. In the exemplary FIG. 3 distribution, the Al specific standard deviation is 28% and the V specific standard deviation is 12%.

The observed inhomogeneities are believed due, at least in part, to input power variations and evaporated ingot chemistry variations. HVPEs are evaporated faster than other elements, so the liquid pool becomes relatively depleted of those elements. Thus, when evaporation achieves a macro steady state, the HVPE concentration in the pool is proportionally less than the base element concentration (i.e., Ti). The reduction is approximately proportional to the difference in vapor pressures. For example, an Al concentration in the pool formed from a Ti-7Al-4V ingot is approximately a tenth of the ingot Al concentration.

Within the macro steady state operation, power variations are first considered. An input power increase melts additional ingot material and causes the volume of the liquid pool to increase. However, the additional material has a higher concentration of HVPE's than does the liquid pool (both in absolute terms and relative to the less-volatile ingot components). For example, the less-volatile components (Ti and V in the example) may be depleted due only to the non-expending intermediate material (Ta in the example). With a roughly 30% Ta concentration, the Ti and V pool concentrations may be about 70% of their ingot concentrations. In distinction, the Al pool concentration may be only about a tenth of its ingot concentration.

The average pool volume is designated as $V_{AVE}$. A rapid power increase (due to a fluctuation) rapidly adds to the pool volume by an increment designated $\delta V$. $\delta V$ may be much less than $V_{AVE}$. Nevertheless, the increment has a concentration of the HVPE (Al) relative to the less-volatile components, much higher than that of the pool This extra amount of the HVPE is rapidly evaporated. Thus, the vapor stream experiences a brief increase in the relative HVPE concentration as the pool returns to equilibrium.

A rapid input power decrease due to a fluctuation may cause resolidification of material in the liquid pool atop the ingot. The resolidified material is relatively HVPE-depleted. As this material is subsequently remelted, the pool and vapor stream will become HVPE-depleted.

Variations in ingot chemistry may produce similar consequences. If a portion of the ingot having a relatively high concentration of an HVPE reaches the pool, there will be a spike in the concentration of that HVPE in the condensate. The high and low HVPE layers may be similar to those associated with power increases. The presence of an ingot portion having a relatively low concentration of the HVPE may produce a similar variation on the effects of a power drop. Chemistry variations may also produce laminations involving the less-volatile components.

With the foregoing in mind, it can be seen that the significance of the inhomogeneities will be related: (1) to the ratio $\delta V/V_{AVE}$; and (2) to the degree of relative depletion of the HVPE's in the pool. $\delta V/V_{AVE}$ could, in theory be reduced by increasing $V_{AVE}$. Assuming a given pool exposed surface (the cross-sectional area for a cylindrical pool and the ingot cross-sectional area if like), then $V_{AVE}$ will be proportional to the pool depth. Pool depth may be increased by increasing the applied power. All things being equal, however, the level of power fluctuations will be roughly proportional to the average power. Thus, simply increasing power may not greatly advantageously influence the ratio. The power increase may also increase pool temperature. Increased temperature will tend to increase relative depletion of HVPE'S. Alternatively, reducing the power may reduce pool temperature and reduce the relative HVPE depletion, but it will tend to adversely reduce the evaporation/deposition rate.

An altered pool chemistry is an option to achieve an improved balance of homogeneity and deposition rate. Advantageously, liquid pool volume is increased and the liquid pool relative HVPE concentration is increased relative to a baseline. Also, advantageously, the deposition rate is at least not substantially reduced relative to the baseline. Pool temperature reduction can be realized by introducing intermediate pool components to reduce the pool melting point but which do not evaporate at levels above desired contamination limits for the condensate.

Selection of such non-expending component(s) is complex. Advantageously, for reduced/minimized pool temperatures, the non-expending component(s) may form near eutectic or near eutectoid compositions with one or more of the ingot components. A near eutectic (eutectoid) composition may be qualitatively or quantitatively characterized in several ways. One quantitative way is by the proximity of the melting point to that of the true eutectic (eutectoid). For example, the melting point may be within an exemplary 5% of that of the true eutectoid on the Kelvin scale. As an approximation of a eutectoid, or an initial step in a further optimization, one may look to a eutectic or eutectoid or near-eutectic or near-eutectoid composition of two or more non-expending components. This may serve as an initial approximation of the relative concentrations of the those components in the pool eutectoid. The initial approximation may be followed by experimental optimization to achieve a closer to eutectoid composition. Advantageously, the non-expending elements have partial vapor pressures less than the partial vapor pressures of the condensate elements (e.g., no more than 1% of the lowest condensate element partial vapor pressure at the pool temperature. Advantageously, the non-expending elements do not form stable chemical compounds with the ingot/condensate elements at the temperature of the pool. With the foregoing in mind, a non-expending combination of Mo and Zr may be used in deposition of Ti—Al—V system condensates (see Table I below for exemplary properties of various materials).

Figure 4:
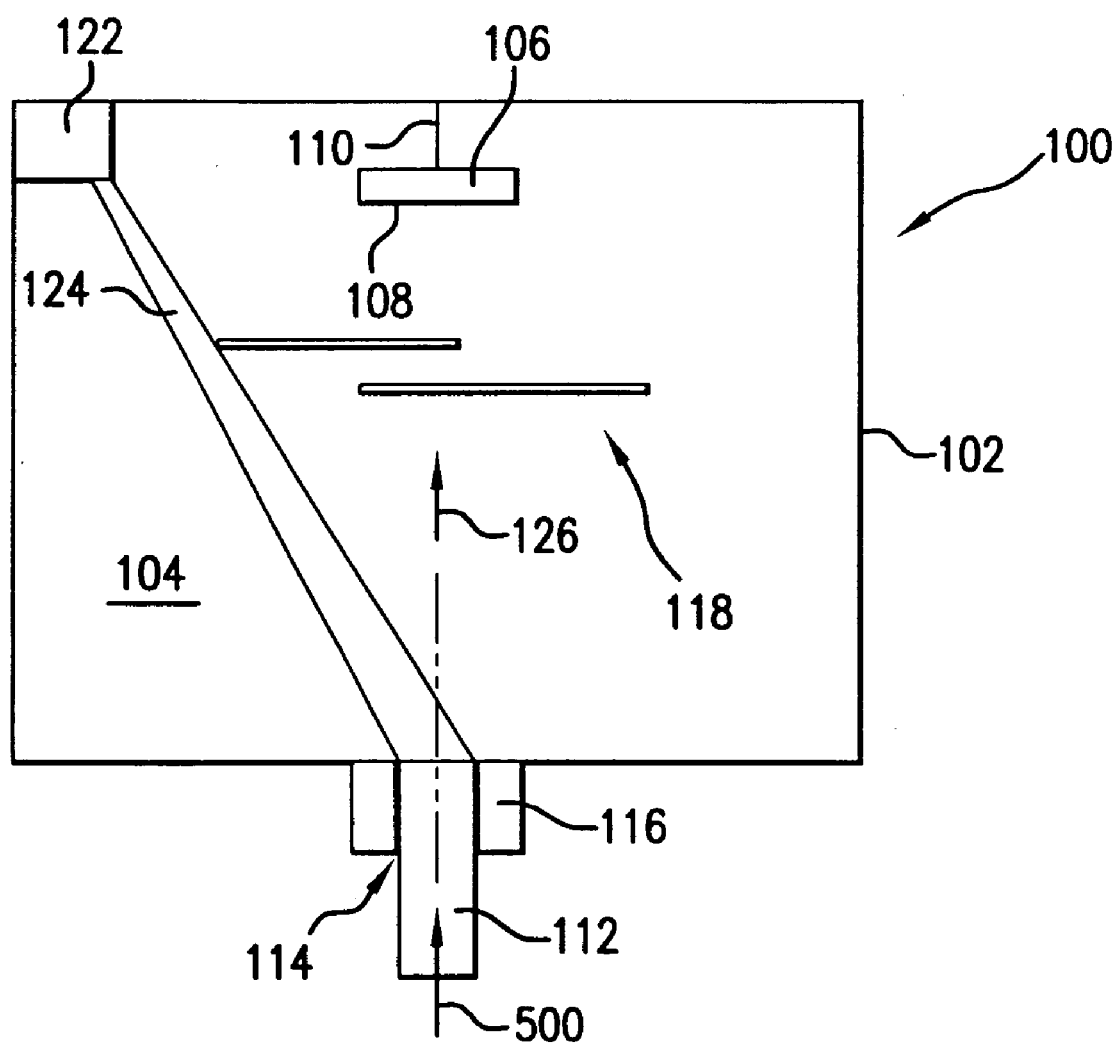
FIG. 4 is a view of an exemplary deposition apparatus.

FIG. 4 shows an EBPVD apparatus 100 for performing the deposition. Various existing or yet-developed apparatus may be used. The apparatus includes a vacuum chamber 102 having an interior 104. A workpiece 106 (e.g., a turbine engine part) having a surface portion 108 for receiving condensate is positioned in the chamber interior and held by a fixture 110. The chamber may have various additional features (not shown) such as an integral vacuum pump for pumping down the chamber, a load lock chamber for introducing and removing the workpiece 106, and various sensors.

The condensate may, at least in part, come from an ingot 112 which may be progressively and continuously inserted into the chamber along an insertion direction 500 through a chamber port 114. The apparatus 100 further includes a crucible 116 into which the ingot is fed. An electron beam source 122 directs a beam 124 toward the crucible to heat the deposition material to form a vapor stream 126. A shutter 118 may selectively block and expose a vapor flow path from the crucible to the workpiece.

Exemplary ingot material is carefully chosen to achieve a desired chemistry for the resulting deposited material. For example, it may be desirable that the deposited material has the same chemistry as the basic substrate material of the workpiece being repaired. Where the latter is a pure elemental material, the former may be likewise. With alloys, however, there may need to be chemistry variations for several reasons. The reasons may vary depending upon the chemistry of the alloy, the structure of the deposition apparatus, and the operational parameters of the deposition apparatus. For example, the lightest vaporized alloy elements (e.g., aluminum in a titanium-aluminum-vanadium alloy and vapor mixture) may be forced toward the periphery of the vapor stream by the heavier elements (e.g., the titanium). To the extent that the workpiece is aligned with the center of the stream, the deposited material will tentatively reduce concentrations of lighter elements relative to their original concentration in the ingot. Accordingly, to achieve a desired deposition material composition, the ingot may have a higher concentration of lighter elements. Thus, to deposit an exemplary Ti-6Al-4V material, a Ti-7Al-4V or Ti-8Al-4V ingot may be utilized. Various parameters of the deposition apparatus and operational parameters may influence the composition of the condensate relative to the ingot.

Figure 5:
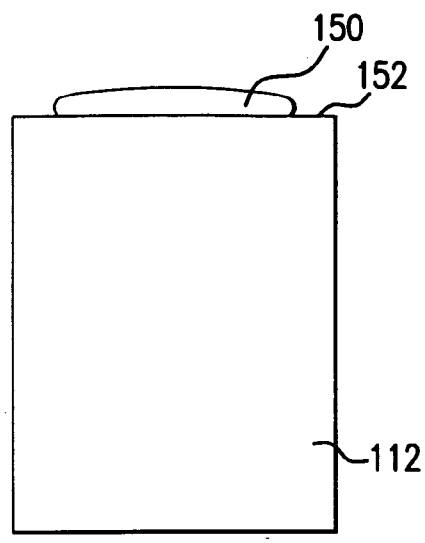
FIG. 5 is a view of a first stage of pool formation.
Figure 6:
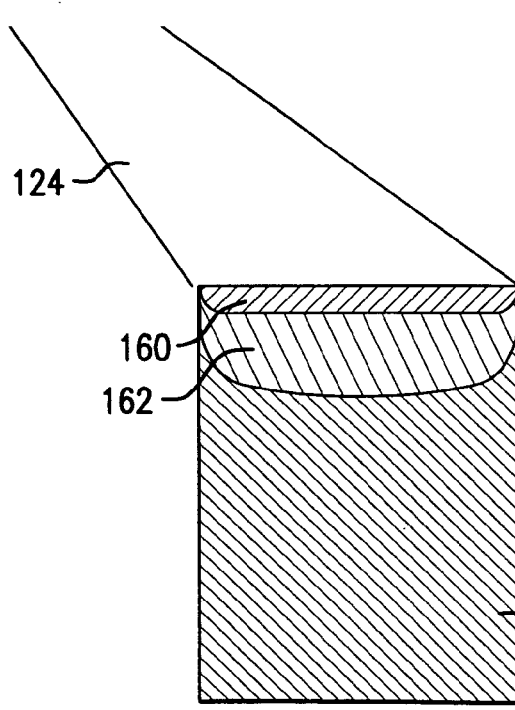
FIG. 6 is a view of a second stage of pool formation.
Figure 7:
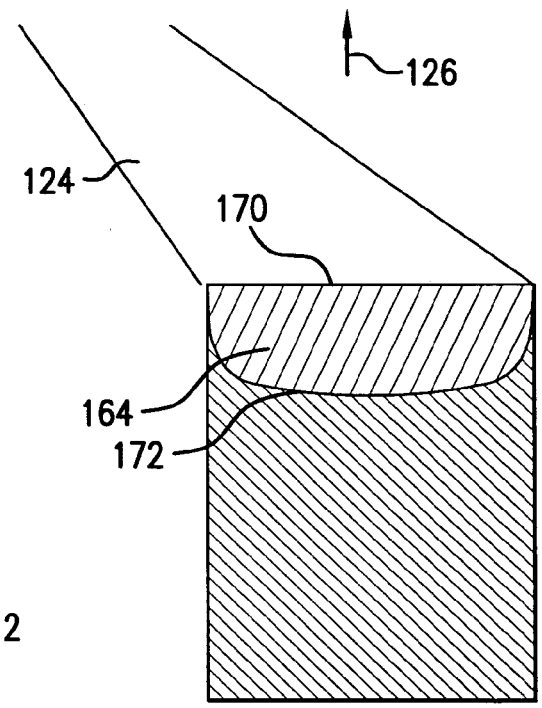
FIG. 7 is a view of a third stage of pool formation.

In an exemplary sequence of operation, the non-expending material 150 is placed on the exposed top end surface 152 of the ingot 112 (FIG. 5). The material 150 may be a mechanical mixture of its component elements (in fine pieces, powders, or the like) or a master alloy of the appropriate composition. The chamber is then evacuated. The electron beam is then directed toward the crucible. Depending on the physical setup, the beam may first melt the material 150 to form an upper pool 160 and then melt a portion of the ingot therebelow to form a lower pool 162 (FIG. 6). The two pools interdiffuse and homogenize into a final pool 164 (FIG. 7), having an exposed surface 170 and an interface 172 with an intact portion of the ingot. The ingot material is continuously melted into the pool at the interface 172 and its components are expelled from the surface 170 as the vapor stream 126 at like rate. As noted above, the pool 164 contains concentrations of the ingot components, with relative depletion of HVPE's. When the steady-state condition is reached, the shutter may be opened.

An exemplary steady-state pool temperature is in the vicinity of 1600-2000° C. The non-expending material consists essentially of a near-eutectic Mo—Zr mixture (e.g., Zr:Mo mass ratio of 2.3:1). An exemplary amount of non-expending material is 50-90 g over an ingot of 70 mm in diameter. The non-expending material is estimated to provide 20-30% of the mass of the final pool 164. An exemplary ingot insertion rate is 0.8-1.2 mm/min. An exemplary deposition rate at the workpiece is 10-20 μm/min.

Figure 9:
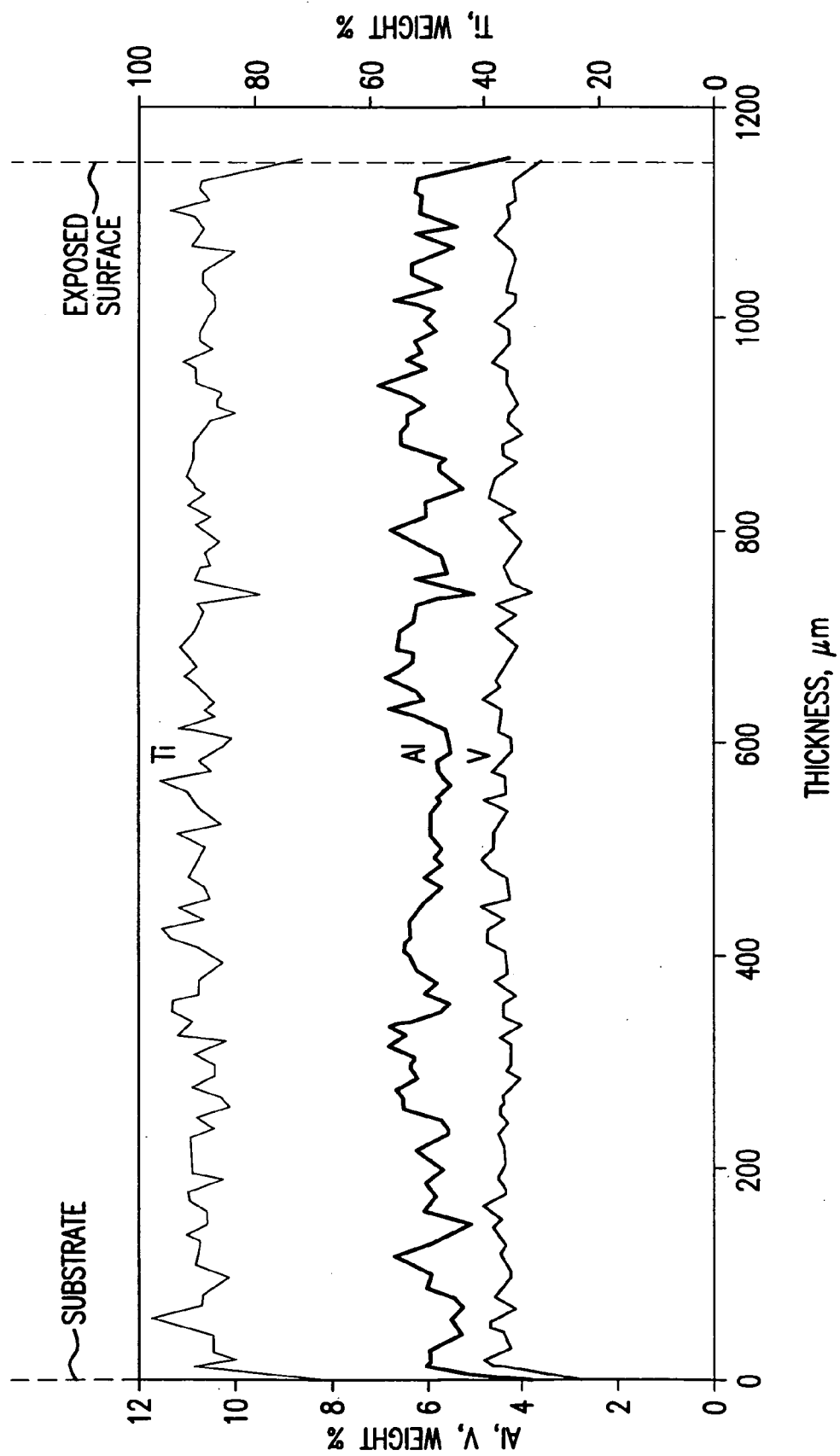
FIG. 9 is a graph of the concentration of the components of the condensate of FIG. 8 across the condensate thickness.

The result is a significant reduction of lamination in Ti-6Al-4V condensates FIG. 8 is a SEM cross-section image of nominal Ti-6Al-4V EBPVD condensate deposited through a non-expending Zr—Mo intermediate. FIGS. 8A-8C are enlarged views of the image of FIG. 8. FIG. 9 is a graph of the concentration of the components of the condensate of FIG. 8 across the condensate thickness. Comparisons with FIGS. 1-3 show a striking reduction in SEM-observed lamination and reductions in characteristic variations in Al and V content of approximately 50% or more. In the FIG. 9 distribution, the Al specific standard deviation is 7% and the V specific standard deviation is 5%. Further eutectoid optimization may provide further improvements.

The eutectic (eutectoid) composition allows reduced pool temperature, and thereby increased pool volume at fixed input power. Although the exact mechanism is unknown, molten eutectic (eutectoid) mixtures are believed characterized by essentially lower viscosity and surface tension than mixtures of the same metals of other compositions. Therefore, the energy needed for atoms to evaporate from the pool surface (the work function) may thus be lower for a eutectic (eutectoid) composition. Thus, despite a decrease in pool temperature, the eutectic (eutectoid) composition might not necessitate a significant decrease in evaporation rate. This would allow the deposition rate to be maintained at an acceptably high level. The low surface tension might also reduce spitting.

As noted above, one or more components of the non-expending material may nevertheless be expended at levels up to acceptable contaminant levels. These components may be replaced. Replacement may be on-the-fly (e.g., by one or more thin feedwires of the components in proportion to their losses and not necessarily to their desired concentrations in the pool). Replacement may be during a shutdown and may be incremental or complete (e.g., by removing and discarding the solidified pool). Complete replacement may be particularly appropriate to also remove contaminants from the pool. The pool may have a tendency to accumulate contaminants from the ingot that have vapor pressures much less than those of the desired condensate components. These contaminants may include, for example, Si and B. Non-volatility or other physical or chemical properties may permit such components to achieve relatively high concentrations in the pool (e.g. up to about 8% by weight, depending upon the material to be deposited, without adversely influencing performance). Potentially such contaminant materials are desirable additives to facilitate ingot manufacture or the initial ingot melting. For example, such additives may form eutectics (eutectoids) with other ingot.

Possible variations include use of a supplemental source to provide one or more additional components of the deposited material. Such additional components may have properties rendering impractical or impossible their passage through the same pool as the other components. Even where individual ones of the additional components could pass through the pool, it may be impractical or impossible to deposit them in sufficient quantities or appropriate combinations. For example, it may be desired to deposit Ti-6Al-2Sn-4Zr-2Mo or Ti-8Al-1Mo-1V. In such material, the Mo and Zr may not readily come from the ingot and pool in substantial quantities (whereas the Sn may). One or more additional sources (e.g., chemical vapor deposition, physical deposition, or sputtering) of such additional materials (the Zr and/or Mo) may be provided The additional sources may direct flows of the additional materials to codeposit with the material passing through the pool to form the desired deposited material chemistry.

The following table shows density and melting point for various condensates, and intermediates, and their components:

TABLE I

| Material | Density (g/cc) | MP (° C.) |
| --- | --- | --- |
| W | 19.30 | 3370 |
| Ta | 16.65 | 2996 |
| Mo | 10.22 | 2617 |
| Zr | 6.53 | 1852 |
| V | 6.11 | 1735 |
| Ti | 4.50 | 1660 |
| Cu | 8.89 | 1083 |
| Sn | 7.29 | 232 |
| Al | 2.70 | 660 |
| Ti6Al4V | 4.43 | 1604-1660 |
| Mo—Zr eutectic | | 1553 |

The potential for high deposition rates and compositional stability may make the foregoing principles applicable to the deposition of high temperature metal alloys for structural applications. These may include Ni-based and Co-based alloys in addition to the Ti-based alloys.

The methods may be used for coating a workpiece or for repairing or remanufacturing a damaged or worn workpiece. The condensate may have like composition to the workpiece (especially in repair/remanufacturing situations. The methods may also be used to build a component or a stock piece (e.g., sheeting) by depositing atop a scaffold or other element from which the condensate is subsequently separates (e.g., by destructive removal of the element).

One or more embodiments of the present invention have been described. Nevertheless, it will be understood that various modifications may be made without departing from the spirit and scope of the invention. For example, he nature of the particular deposition apparatus and the desired condensate may influence the chosen intermediate pool material. Accordingly, other embodiments are within the scope of the following claims.

What is claimed is:

1. A method for depositing a first material on a substrate comprising:
   providing the substrate in a deposition chamber; and
   forming a molten body between the substrate and a source of the first material by melting one or more second materials;
   passing a flow of the first material through the molten body and from the molten body to the substrate as a vapor flow,
   wherein an essentially non-expending portion of the molten body comprises an alloy having a melting temperature below a melting temperature of the first material.

2. The method of claim 1 wherein:
   the first material is Ti-based.

3. The method of claim 1 wherein:
   the second material comprises Zr and Mo;
   the first material comprises Ti, Al, and V.

4. The method of claim 3 wherein:
   the Al and V are deposited with specific standard deviations no greater than 10%.

5. The method of claim 3 wherein:
   the deposited first material has a thickness of at least 2 mm.

6. The method of claim 1 wherein:
   the first material is codeposited with a third material to form a condensate.

7. The method of claim 6 wherein:
   the third material does not pass through the molten body.

8. The method of claim 6 wherein the condensate comprises:
   at least one weight percent of one or each of Zr and Mo from said third material.

9. The method of claim 6 wherein the condensate consists essentially of one of:
   Ti-6Al -2Sn-4Zr-2Mo; and
   Ti-8Al-1Mo-1V.

10. The method of claim 1 wherein:
    the nonexpending portion comprises, by weight, at least 50% Zr and at least 20% Mo.

11. The method of claim 1 wherein:
    the nonexpending portion comprises, in major weight part, a near-eutectic mixture of two elements.

12. The method of claim 1 wherein:
    the second material consists essentially of Zr and Mo;
    the first material consists essentially of Ti, Al, and V.

13. The method of claim 1 wherein:
    the substrate is a Ti-alloy turbomachine part.

14. The method of claim 1 further comprising:
    separating the deposited first material from the substrate.

15. The method of claim 14 wherein:
    the separating comprises releasing, nondestructive of the substrate.

16. The method of claim 14 wherein:
    the separating is destructive of the substrate.

17. The method of claim 1 wherein:
    the substrate is a damaged part and the first material replaces lost material.

18. A method for depositing a Ti-based first material on a substrate, the method comprising:
    placing the substrate in a deposition chamber;
    forming a molten body between the substrate and a source of one or more components of the first material by melting one or more second materials including Zr and Mo; and melting said one or more components of the first material from said source so that said one or more components are transported through the molten body to a top surface where they are preferentially evaporated with respect to the Zr and Mo thereby forming a vapor stream; and collecting a condensate having a thickness from the vapor stream.

19. The method of claim 18 wherein:
the first material comprises Ti, Al, and V.

20. The method of claim 18 wherein:
the second material consists essentially of Zr and Mo;
the first material consists essentially of Ti, Al, and V.

* * * * *